United States Patent [19]
Harrison et al.

[11] 3,859,654
[45] Jan. 7, 1975

[54] ANALOG TO DIGITAL CONVERTER FOR ELECTRICAL SIGNALS

[75] Inventors: Thomas J. Harrison, Boca Raton; George A. Hellwarth, Deerfield Beach; Richard C. Jaeger, Boca Raton, all of Fla.

[73] Assignee: International Business Machines Corporation, Armonk, N.Y.

[22] Filed: Oct. 11, 1972

[21] Appl. No.: 296,707

[52] U.S. Cl...... 340/347 AD, 235/92 CA, 324/99 D, 340/347 NT

[51] Int. Cl. .............................................. H03k 13/20

[58] Field of Search... 340/347 AD, 347 NT; 320/1; 235/92 CA, 92 CC; 324/99 D

[56] References Cited

UNITED STATES PATENTS

| | | | |
|---|---|---|---|
| 2,787,418 | 4/1957 | MacKnight et al. | 340/347 AD |
| 2,801,281 | 7/1957 | Oliver et al. | 340/347 AD |
| 3,228,025 | 1/1966 | Welch | 340/347 |
| 3,260,943 | 7/1966 | Huelsman et al. | 328/69 |
| 3,294,958 | 12/1966 | Du Vall | 235/92 CA |
| 3,298,019 | 1/1967 | Nossen | 235/92 Ca |
| 3,303,493 | 2/1967 | Charbonnier | 340/347 Ad |
| 3,316,547 | 4/1967 | Ammann | 340/347 Ad |
| 3,449,741 | 6/1969 | Egerton, Jr. | 340/347 AD |
| 3,462,759 | 8/1969 | Hoffman | 340/347 AD |
| 3,488,652 | 1/1970 | Huelsman | 340/347 |
| 3,585,634 | 6/1971 | Sharples | 320/1 |
| 3,588,881 | 6/1971 | Gordon | 340/347 AD |
| 3,599,203 | 8/1971 | Conley | 320/1 |
| 3,603,975 | 9/1971 | Gordon | 340/347 AD |
| 3,628,148 | 12/1971 | Brolin | 325/38 B |
| 3,659,288 | 4/1972 | Taylor | 340/347 AD |
| 3,685,048 | 8/1972 | Pincus | 340/347 AD |
| 3,696,398 | 10/1972 | Pomella et al. | 340/92 CA |
| 3,716,849 | 2/1973 | Metcalf | 340/347 AD |
| 3,733,600 | 5/1973 | Hellwarth et al. | 324/99 D |
| 3,737,897 | 6/1973 | Cuthbert et al. | 340/347 AD |

OTHER PUBLICATIONS

"Inexpensive Digital Voltmeter"–D. J. G. Janssen, Electronic Applications, Volume 29, No. 4, 1969, pages 117–124.

"Integrating Digital Voltmeter: Operating Principles and Accuracy"–P. A. Neeteson, Electronic Application Bulletin, Volume 31, No. 1, January 1972.

"Recent Advances in Digital Voltmeter Design"; D. J. G. Janssen; Digest of Technical Papers, 1972, IEEE International Solid-State Circuits Conference, pg. 152–153.

Korn and Korn; Electronic Analog and Hybrid Computers; McGraw-Hill, Co., 1964; pp. 471–474.

Propster, Jr.; "Analog to Digital Converter"; IBM Technical Disclosure Bulletin; Jan. 1963; pp. 51–52.

*Primary Examiner*—Eugene G. Botz
*Assistant Examiner*—Errol A. Krass
*Attorney, Agent, or Firm*—John C. Black; Carl W. Laumann, Jr.; J. Jancin, Jr.

[57] ABSTRACT

Unknown bipolar analog signals are converted to equivalent digital signals by comparison with positive and negative reference voltages. Sampling is performed for a preselected time period during which the reference voltages are alternately compared against the unknown analog signal. The reference polarity is switched each time the comparison result indicates a polarity change. Counting of clock pulses during all times one of the reference voltages is applied for the preselected period results in the digital equivalent of the analog input.

11 Claims, 9 Drawing Figures

Patented Jan. 7, 1975 3,859,654

7 Sheets-Sheet 7

ANALOG TO DIGITAL CONVERTER FOR ELECTRICAL SIGNALS

BACKGROUND OF THE INVENTION

1. Field of the Invention.

This invention relates to circuitry for converting unknown analog input signals into equivalent digital output signals. More particularly, the present invention relates to circuitry for generating a digital word of information whose binary significance represents the magnitude of an unknown analog signal. The present invention is particularly useful for changing analog signals into digital quantities so that they can be manipulated by data processing equipments. The present invention is applicable to sampling a wide variety of unknown analog signals of either polarity such as might be produced at the output of a multiplexer and converting each of those sample signals to digital representations for a relatively wide range of magnitudes. The present invention will sometimes be referred to as a delta-sigma analog-to-digital converter (ADC).

2. Description of the Prior Art.

Various approaches for converting analog signals to their equivalent digital manifestations have been suggested in the past. Some of these approaches have followed the successive approximation concept which uses a sequence of logical decisions to reduce the difference between reference voltages and the unknown signal. The successive approximation ADC can provide relatively accurate conversion results but generally requires acceptance of sophisticated and expensive circuitry.

Another approach is suggested by the integrating ramp analog to digital converter circuit such as is shown in the January, 1963 IBM TECHNICAL DISCLOSURE BULLETIN at Pages 51–52 in the article entitled "Analog to Digital Converter" by C. H. Propster, Jr. Although somewhat less expensive than successive approximation ADC's, the integrating ramp ADC is considerably slower. Improvements which increase this speed at a cost of slightly greater circuit complexity have been shown in U.S. Pat. No. 3,577,140, "Triple Integrating Ramp Analog to Digital Converter," by H. B. Aasnaes and application Ser. No. 131748 now U.S. Pat. No. 3,733,600 filed Apr. 6, 1971, "Improved Analog to Digital Converter Circuits," by G. A. Hellwarth and J. E. Milton, both of which are assigned to the same assignee as this invention.

Delta-sigma modulation has been shown in the November, 1963 Proceedings of the IEEE in the article entitled, "A Unity Bit Coding Method by Negative Feedback," by Inose, et al., (Pages 1524–1535). The unique characteristic of this type of modulation of an analog signal to a digital representation is that each binary digit or bit of information is equally weighted. No digital word or true A to D conversion to a binary encoded number is ever accomplished to represent the magnitude of a sample of the input signal. Instead, each output bit does not have any direct correspondence to the input signal, but must be further summed with many others to form an average value to represent the input. Also, since there is no periodic sampling of the input signal, the delta-sigma modulator operates continuously.

There is a need for analog to digital converter circuitry which can provide the conversion function at relatively low cost but with a high degree of accuracy. More particularly, there is a need for an uncomplicated but accurate ADC that can be constructed from components that are inexpensive and therefore subject to loose tolerances in manufacturing and operation. To maintain low cost, the circuit must be independent of active elements such as integrating amplifiers and also impervious to component drifting and dead-bands as are encountered in nulling type ADC circuits. The high cost, drift sensitivity or other limitations of the prior art ADC circuits frequently represent unacceptable penalties.

SUMMARY OF THE INVENTION

The present invention employs positive and negative reference voltages of known magnitudes and switches between these two references for providing a feedback signal to be compared against an unknown analog input signal. This comparison can be performed on the basis of the reference signal and the average of the unknown analog, the average of the reference signal and the unknown analog directly, or the average of both the reference and unknown analog signals. In response to a sampling signal subsequent to passing a zero reference in comparing the reference voltage generated signal against a signal correlated to the unknown analog, a switching function is performed to change the polarity of the reference voltage being utilized. This reference voltage polarity switching operation is continuously performed throughout a fixed time period. Accordingly, by counting the number of clock pulses which occur during the fixed time sampling period that a particular polarity of reference voltage is applied, a digital representation of the unknown analog input magnitude is produced. By this arrangement, unknown analog signals of either polarity can be handled and the conversion function performed with relatively few and low cost elements so that the accuracy of the result is not significantly affected by drift of the components involved.

A primary objective of the present invention is to provide an analog to digital conversion function.

A further object of the present invention is to convert unknown bipolar analog signals into digital output signals by comparing the unknown input signal against a modulated reference voltage over a fixed time period.

A further object of the present invention is to provide relatively low cost but highly accurate analog to digital conversion of bipolar analog input signals using digital counting techniques.

The foregoing and other objects, features and advantages of the present invention will be apparent from the following more particular description of the preferred embodiments of the invention as are illustrated in the accompanying drawings.

DESCRIPTION OF THE PREFERRED EMBODIMENT

Figure 1:
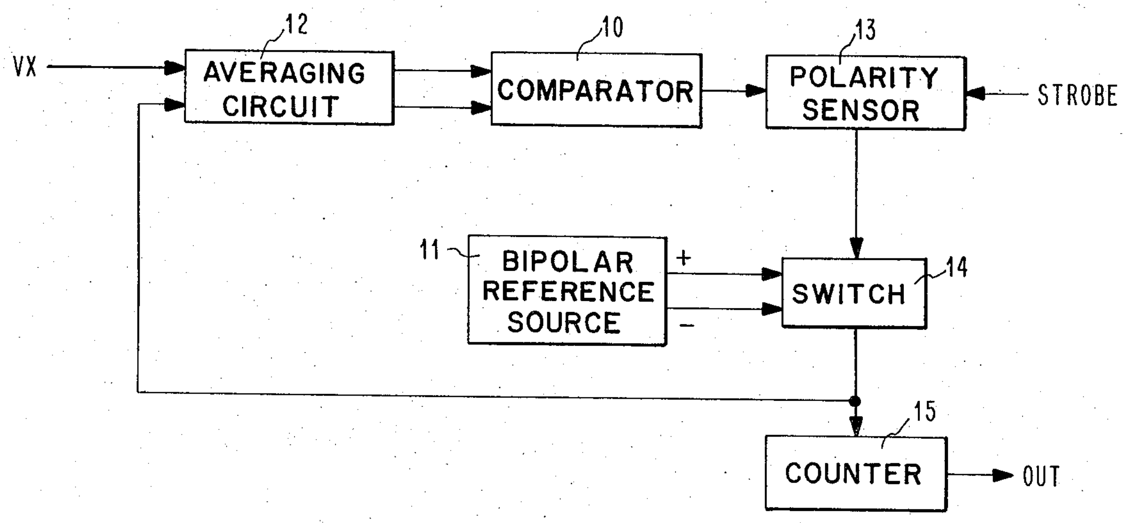
FIG. 1 shows the interrelationship of the generalized functional blocks used in the present invention.
Figure 2:
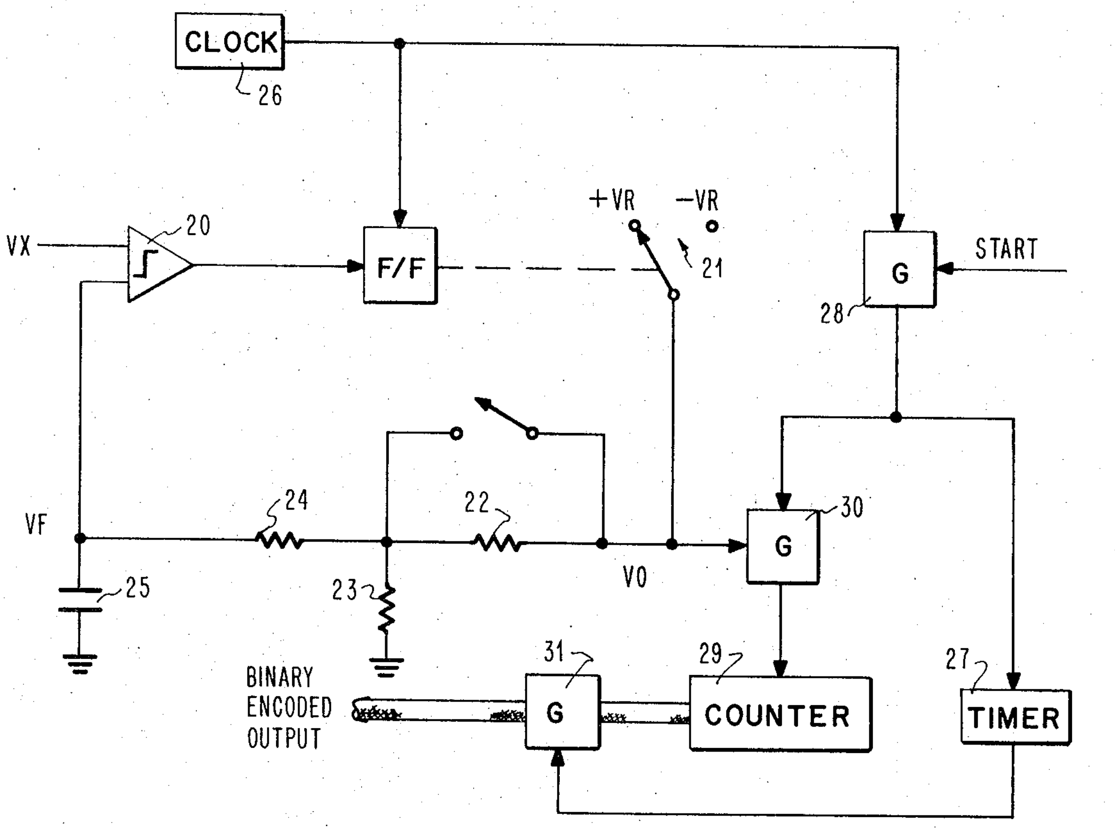
FIG. 2 is a somewhat more detailed circuit diagram of an analog to digital converter circuit in accordance with the present invention.
Figure 5:
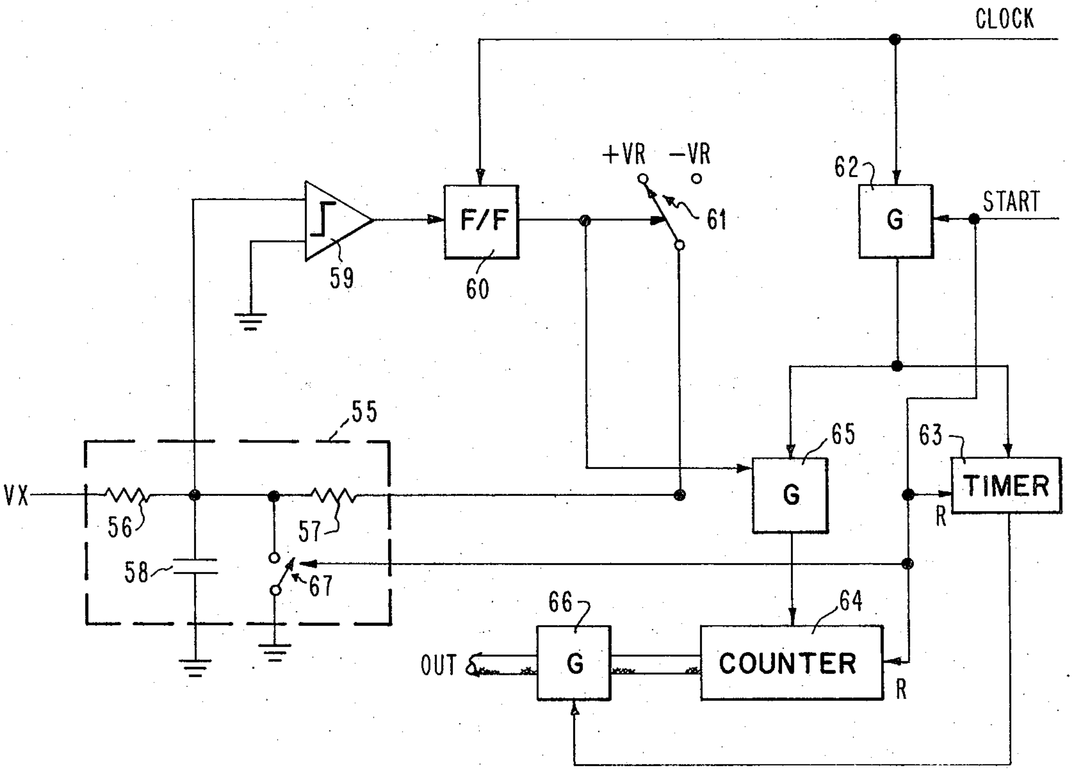
FIG. 5 shows another arrangement for implementing the present invention.
Figure 7:
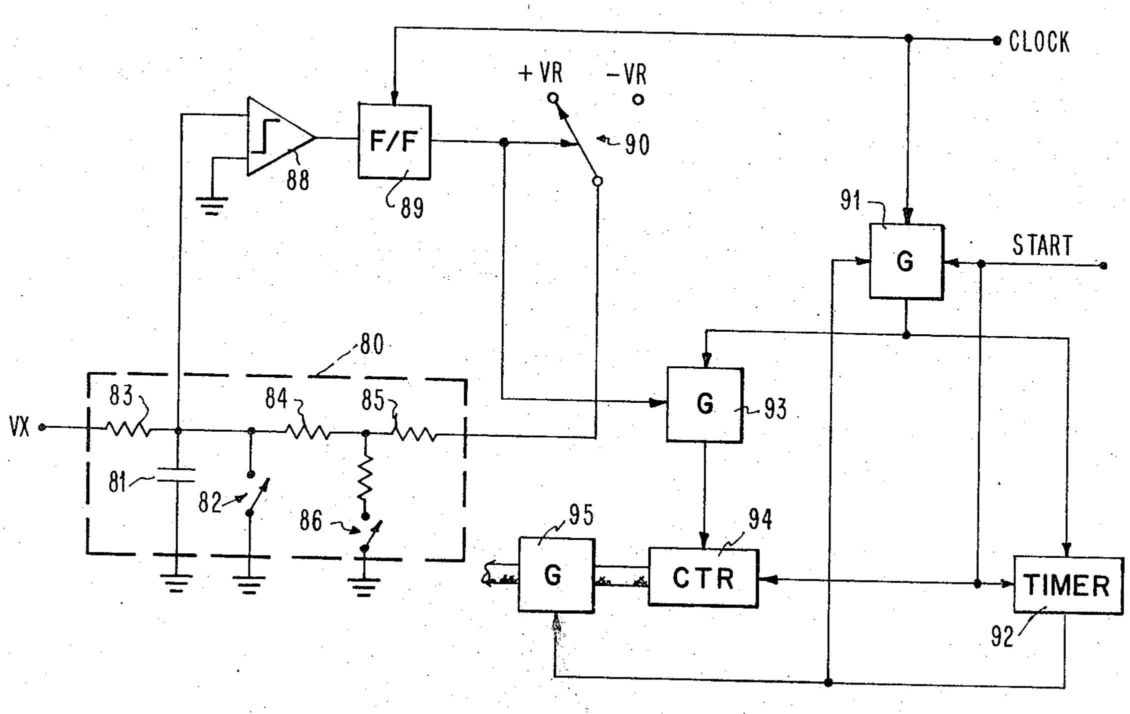
FIG. 7 is another schematic circuit of an additional embodiment of the present invention.

The general block arrangement of the present invention is illustrated by FIG. 1. Unknown analog signals VX of positive or negative polarity or zero level are introduced as shown to a comparator circuit 10 via averaging network 12. Bipolar reference source 11 is switched by polarity sensor 13 and switch 14 as a function of the polarity of the output from comparator 10. For instance, a positive output from comparator 10 will cause sensor 13 when strobed by a pulse to set switch 14 so as to produce a negative reference voltage output to be used as the other input to averaging network 12 and thence to provide the other input of comparator 10. The bipolar reference sources are preferably of known, fixed magnitudes. Therefore, the polarity of the fixed reference signal from source 11 is switched each strobe time following a polarity change of the output of comparator 10, these polarity changes being a function of the comparison of the feedback voltage through 12 and the unknown analog input VX. As will be more fully appreciated from the later description of the several illustrated embodiments of this invention such as is shown in FIGS. 2, 5 and 7, averaging network 12 can be designed to provide any of several possible combinations for the two inputs to comparator 10. For instance, the output of network 12 could be (1) the average of the feedback reference and VX directly, (2) the feedback reference signal directly and the average of VX, or (3) the average of a summation of the feedback reference with VX and a fixed signal level such as ground. As will also be seen later, network 12 can be composed of relatively simple coupling and/or low pass filter elements.

During a fixed time sample period defined by means not shown in FIG. 1, a counter 15 is incremented by pulses from a continuously running clock during the times of the fixed sample period that one of the bipolar reference sources is being applied to circuit 12. The end of the fixed time period will produce a resulting output count from counter 15 which corresponds to the binary encoded digital manifestation of the unknown analog input being sampled during that particular time period. For a circuit operating in accordance with a configuration such as is shown in detail for FIG. 2, it is generally anticipated that counter 15 will be operational only when the positive reference source is being applied as feedback but it could also be operational during negative reference source feedback. Another alternative is to switch between two different counter stages, one accumulating counts during the positive reference feedback and the other accumulating counts during the negative reference application so that the composite should represent a count of the complete time period.

Since it is known how many clock pulses should have occurred during the fixed time period that the sample has been taken, the count contained in counter 15 at the end of that sampling period will be proportional to the magnitude of the unknown input VX provided that counting has been performed during application of the reference source having an appropriate polarity. If counting is effected during the opposite polarity reference source, the resulting digital count represents the negative of the unknown analog input VX and this would have to be taken into account when the resulting digital output is utilized in the data processing equipment.

FIG. 2 shows a somewhat more detailed diagram of one embodiment of the present delta-sigma analog to digital converter for electrical signals. The unknown voltage of either polarity is applied to one input of comparator 20, and this voltage is compared to a capacitor feedback voltage V$f$. At successive clock times, the comparator output is gated and used to control switch 21 which selects one of two equal but oppositely poled reference voltages, VR or −VR. This reference voltage is applied to the low pass filter network composed of resistors 22 – 24 and capacitor 25 which generates the above mentioned voltage V$f$. Measurement of V$x$ commences with the gating of the clock signal 26 into the timer 27 via gate 28 in response to the Start signal which, if desired, can also be used to reset timer 27 and counter 29. The counter 29 gated by the reference drive via gates 28 and 30 counts the number of time periods N$c$ in which the switch 21 is connected to the positive reference. The timer 27 determines the base time interval equal to $2^{N+1}$ counts for a bipolar converter with N-bit resolution and a sign bit. V$x$ is then determined by:

$$Vx = VR\ (NC/2^N - 1)$$

where: $0 \leq Nc \leq 2^{N+1}$

Figure 3:
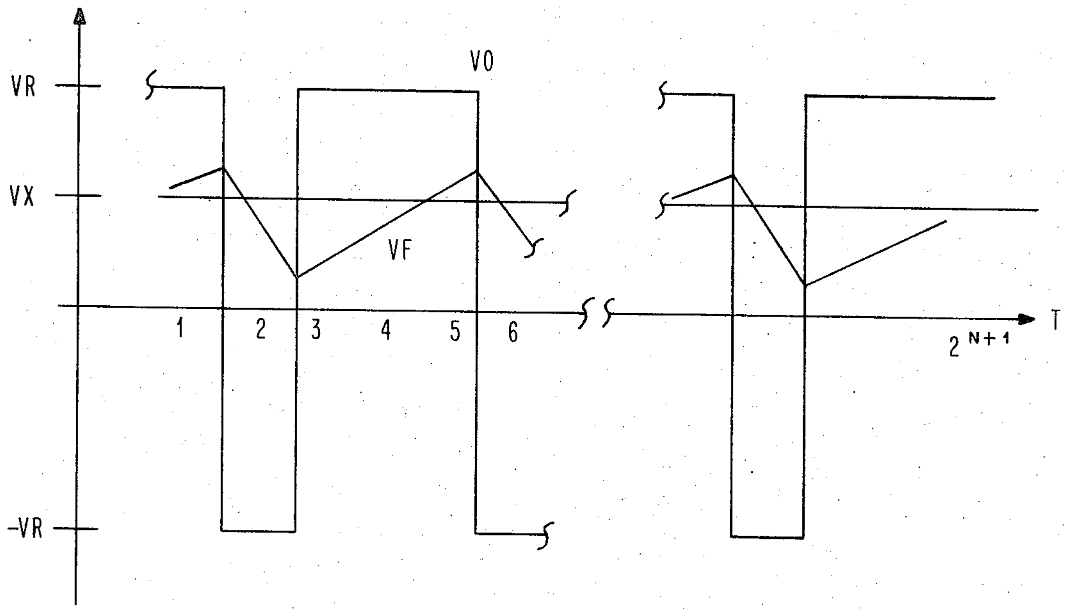
FIG. 3 is a time-base diagram of the operation of circuitry such as FIG. 2.

The signal V$x$ could likewise be determined by appropriate formulation using the counter 29 to count the number of time periods in which switch 21 is connected to the negative reference. Upon completion of the preselected time period equal to $2^{N+1}$ clock counts defined by timer 27, the binary encoded digital contents of counter 29 can be gated out via gates 31. The clock pulse counting ceases when timer 27 times out such as by dropping the Start signal, deconditioning to gate 28 or the like. An example of a FIG. 2 operation waveform for a positive input voltage V$x$ is shown in FIG. 3. This illustrates that each time the relative difference between V$x$ and V$f$ changes polarity, the reference voltage is switched in response to the next clock pulse. That is, whenever V$f$ exceeds V$x$, the comparator sees a negative differential voltage and switches in the negative reference. Conversely, a V$f$ smaller than V$x$ causes a positive differential voltage and the positive reference is switched in. Thus the circuit is continuously trying to reduce the comparator differential input to zero but can never actually reach such a null state because of the large magnitude of the reference voltages. FIG. 3 also shows that the number of clock pulses occurring and being counted by 29 is larger during application of the positive reference voltage relative to negative voltage application thereby reflecting both polarity and magnitude of V$x$. Note that the vertical scale excursions of $Vf$ for purposes of emphasis in explaining the operation of this invention are shown greatly exaggerated in FIG. 3 as compared to a waveform that might actually be seen on an oscilloscope. For a typical case where VR is 5 volts, the ripple of $Vf$ would be approximately 5 millivolts.

Figure 4:
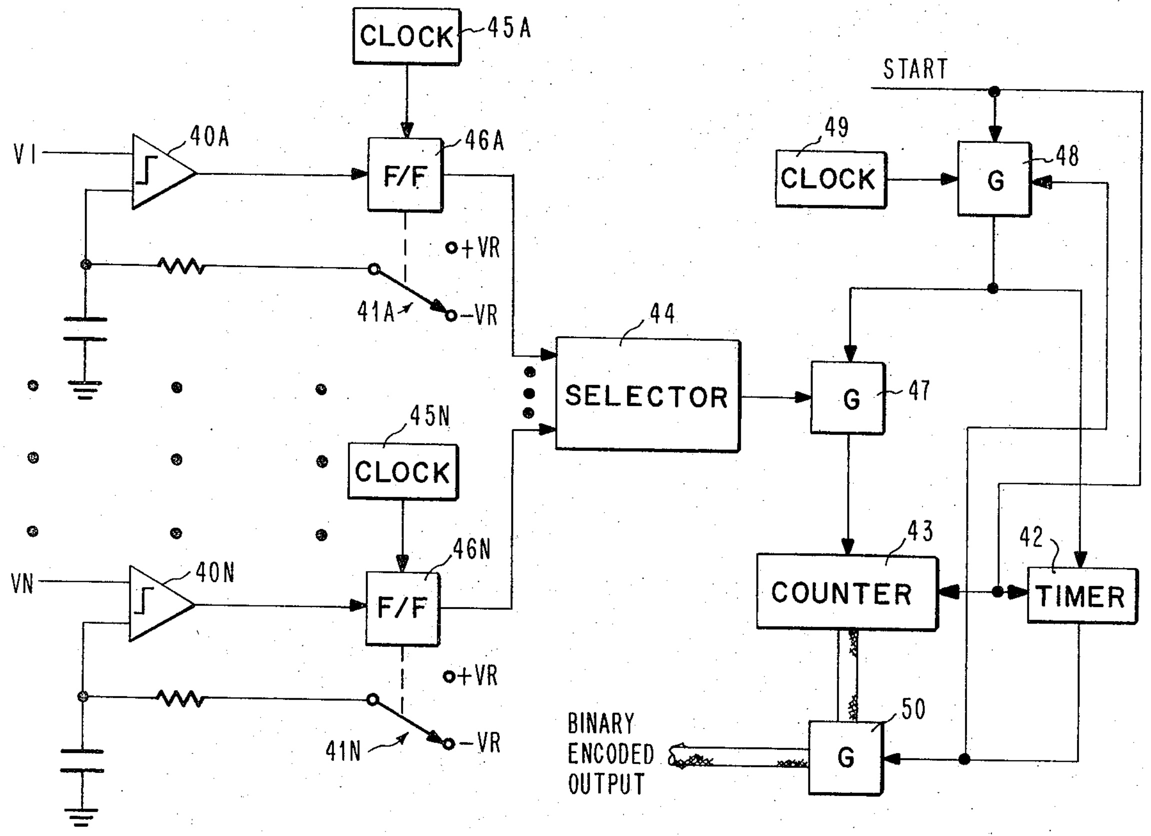
FIG. 4 shows an arrangement using the general concept of the FIG. 2 embodiment in a time-shared, multiplex input configuration.

FIG. 4 shows one method of using the present invention in an environment in which there are multiple comparators 40A – 40N and reference networks 41A – 41N and in which the timer 42 and counter circuitry 43 is multiplexed via selector 44 to determine the unknown voltage on a desired input. As indicated above, the full scale range of the converter is determined by the voltage VR. Gain selection may be accomplished by changing VR or equivalently selecting an appropriate attenuator such as resistances 22 – 24 of FIG. 2 in the feedback network. Each of the reference networks 41A – 41N independently switch between their associated reference voltages as a function of the polarity comparison result from the appropriate comparator 40A – 40N and the clock 45A – 45N pulses. By well known digital logic multiplexing techniques, the input to be converted is chosen by selector 44 and coupled to gate 47. In coordination with the input selection, the Start signal resets timer 42 and counter 43 and actuates gate 48 to commence transferring clock pulses to timer 42 and counter 43 via gate 47 with the digital conversion result being transferred to the binary output via gate 50 substantially in the manner described for FIGS. 1 and 2. In this manner, each of the voltage reference sections 41A – 41N can be continually in operation thereby providing even greater operating stability.

It should be recognized that a source of error exists initially if $Vx$ other than zero is applied with no appropriate charge present on the capacitor providing the $Vf$ input to the comparator. This means in a case such as shown in FIG. 3 wherein a large positive $Vx$ is initially applied the capacitor voltage $Vf$ will have to start from zero and rise until $Vf$ exceeds $Vx$. The next clock pulse thereafter will switch the negative reference into the feedback but a portion of this initial $Vf$ rise may represent a relatively large error in the total clock pulses counted during the conversion cycle. The continuous operation of the various comparator sections 40A – 40N in a multiplexed input configuration such as FIG. 4 has the advantage that this start-up error is removed. Even for a zero capacitor charge in a FIG. 2 type circuit, the worst case error can be easily determined from the magnitude of the reference voltage, the value of the R-C network and the converter resolution (e.g.: the time to charge the capacitor to a voltage within one least significant bit of $Vx$). Thus the length of time of operation of the sample controlling timer can be set to reduce the significance of the error to an acceptable level. If greater accuracy is desired, logic circuitry could be included to detect that at least one or two reference voltage switchings have occurred after receipt of a Start signal before permitting the gating of clock pulses into the timer and counter circuits. Alternatively, detection of a sequence of two transitions of the comparator 20 output polarity could be used to reset both timer 27 and counter 29.

FIG. 5 shows a block diagram of another arrangement of the present delta-sigma ADC. The unknown voltage $Vx$ is applied to one input of the summation and filter network 55 composed of resistors 56 – 57 and capacitor 58. A selected reference voltage of either positive or negative polarity is applied to a second input of network 55. The output of the network is compared to the ADC ground potential in comparator 59. At each successive time interval, the comparator output is gated into flip-flop 60 and used to control switch 61 which selects one of the two reference potential polarities, +VR or −VR.

Measurement of $Vx$ begins with the Start signal conditioning gate 62 to couple the clock signal into the timer 63. In the FIG. 5 arrangement, the capacitor 58 voltage oscillates about the zero level in contrast to FIG. 2 where the capacitor voltage oscillates around $Vx$. This can be seen by comparison of FIG. 3 for the FIG. 2 operation with FIG. 8 which illustrates FIGS. 5 and 7 operation. Accordingly, the counter 64 of FIG. 5, gated by the reference drive through gate 65, counts the number of time periods in which switch 61 is connected to the negative reference. The timer 63 determines the base time period equal to $2^{N+1}$ counts for a bipolar converter with N-bits plus sign resolution. $Vx$ is then determined by the same equation mentioned for FIG. 2, where $Nc$ is the number in the counter 64 at the end of the base time interval. This count can be gated via gate 66 to the utilizing data processing equipment. If resistors 56 and 57 are not of the same value, then the computation of $Vx$ according to the aforementioned formula must be multiplied by the factor R1/R2 where R1 is the value of resistance 56 and R2 is the value of resistance 57.

Switch 67 is turned off at the start of the conversion interval and on at the end of the conversion. This switch establishes a known, approximately zero, initial condition on the capacitor 58 to allow immediate start of a conversion cycle. Application of $Vx$ directly to the network 55 and the addition of switch 67 permit the converter to operate without an initializing interval and the converter is suitable for efficient operation in a multiplexing environment.

Figure 6:
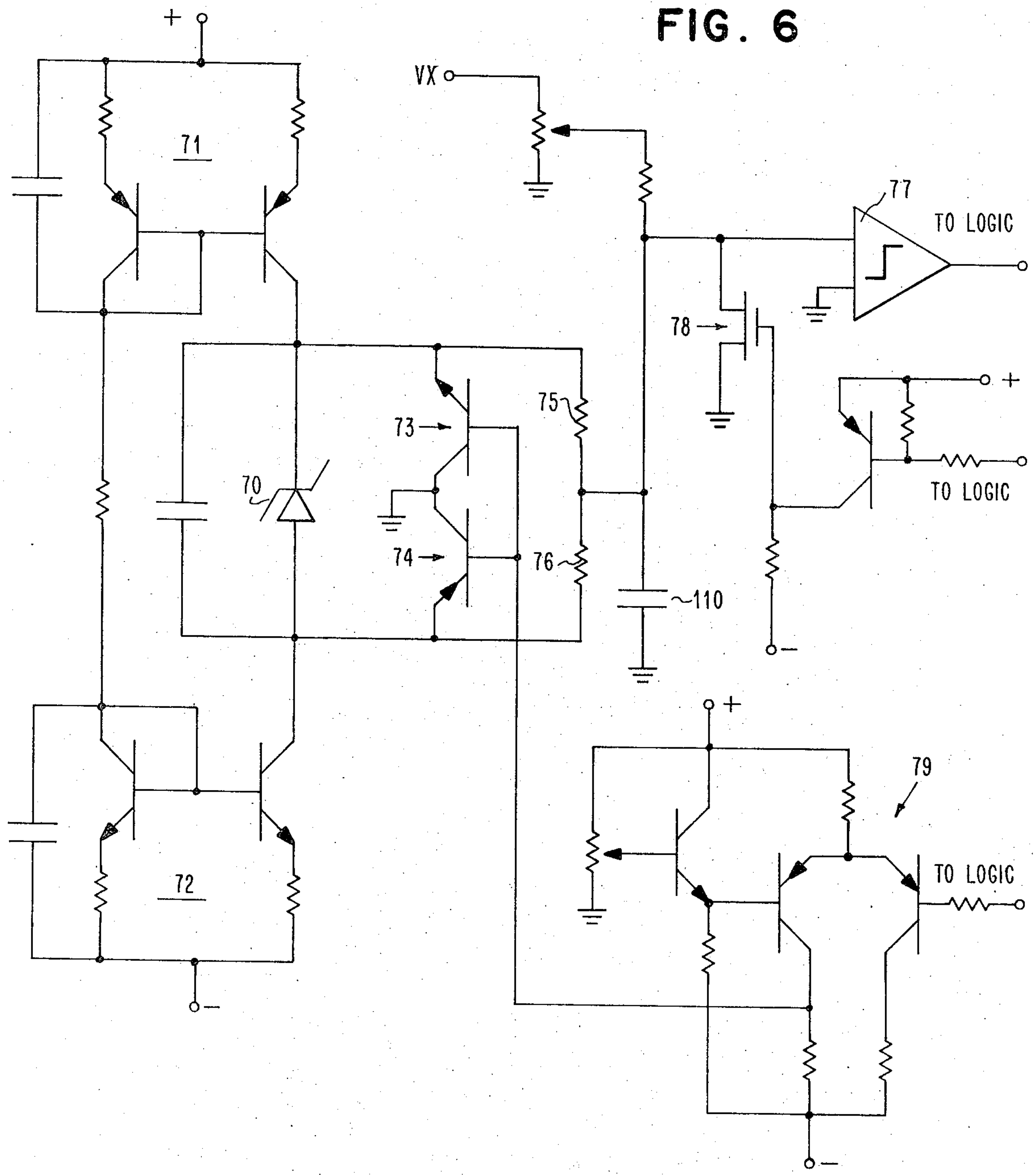
FIG. 6 illustrates a voltage reference switching and generating circuit useful in the present invention.

FIG. 6 shows an implementation of the delta-sigma switchable voltage reference. A zener diode 70 is driven by two current sources 71 and 72 providing a floating voltage reference. Inverted complementary bipolar transistors 73 and 74 provide high-speed switching of either side of the zener diode to ground potential with low impedance and low offset voltage. The reference voltages, +VR or −VR, are then obtained at the center of two equal resistors 75 and 76 connected across the zener diode. These two resistors are the only precision components in the ADC. That is, the delta-sigma ADC maximizes the use of digital circuitry and minimizes the use of precision components.

As discussed for FIG. 5, the reference voltage selected is averaged by capacitor 110 and resistors 75–76 and compared against $Vx$ by comparator 77 provided switch 78 is not actuated. The polarity change detection then results in actuation of driver network 79 so as to select either transistor 73 or 74.

FIG. 7 illustrates several variations of the previously described circuitry of this invention. During the operation of this ADC, the voltage on capacitor 81 in network 80 is set equal to zero immediately prior to the conversion cycle by closing switch 82 and remains nulled near zero throughout the cycle. This allows true integration or averaging of $Vx$ and the reference voltage to be accomplished during the conversion without the addition of an active integrator amplifier since the currents through resistors 83 – 85 are not affected by a changing capacitor summation voltage. Switch 86 selection controls the reference voltage attenuation as discussed previously. Additionally, the fact that filter capacitor 81 is common for both the unknown and reference voltages means its capacitance does not affect conversion accuracy.

Comparator 88, polarity detection F/F 89 and reference voltage switch 90 operate substantially as discussed before. Also arrival of the Start signal actuates gate 91 to clock pulses into timer 92 and gate 93 which in this instance is conditioned by the output of F/F 89 that selects the negative VR through switch 90. This same Start signal clears timer 92 and counter 94 while the end of the timer period causes deconditioning of gate 91 and the content of counter 94 to be transferred as a digital output through gates 95.

For simplicity, the initial polarity of VR applied can be the same particularly for FIGS. 5 or 7 since a maximum of one count ambiguity would result. The same applies to FIG. 2 if the initialization ambiguity is not significant or if the aforementioned error resolving logic is included. However, the polarity of V*x* can be sensed and the initially applied VR selected for the appropriate polarity if desired.

Figure 8:
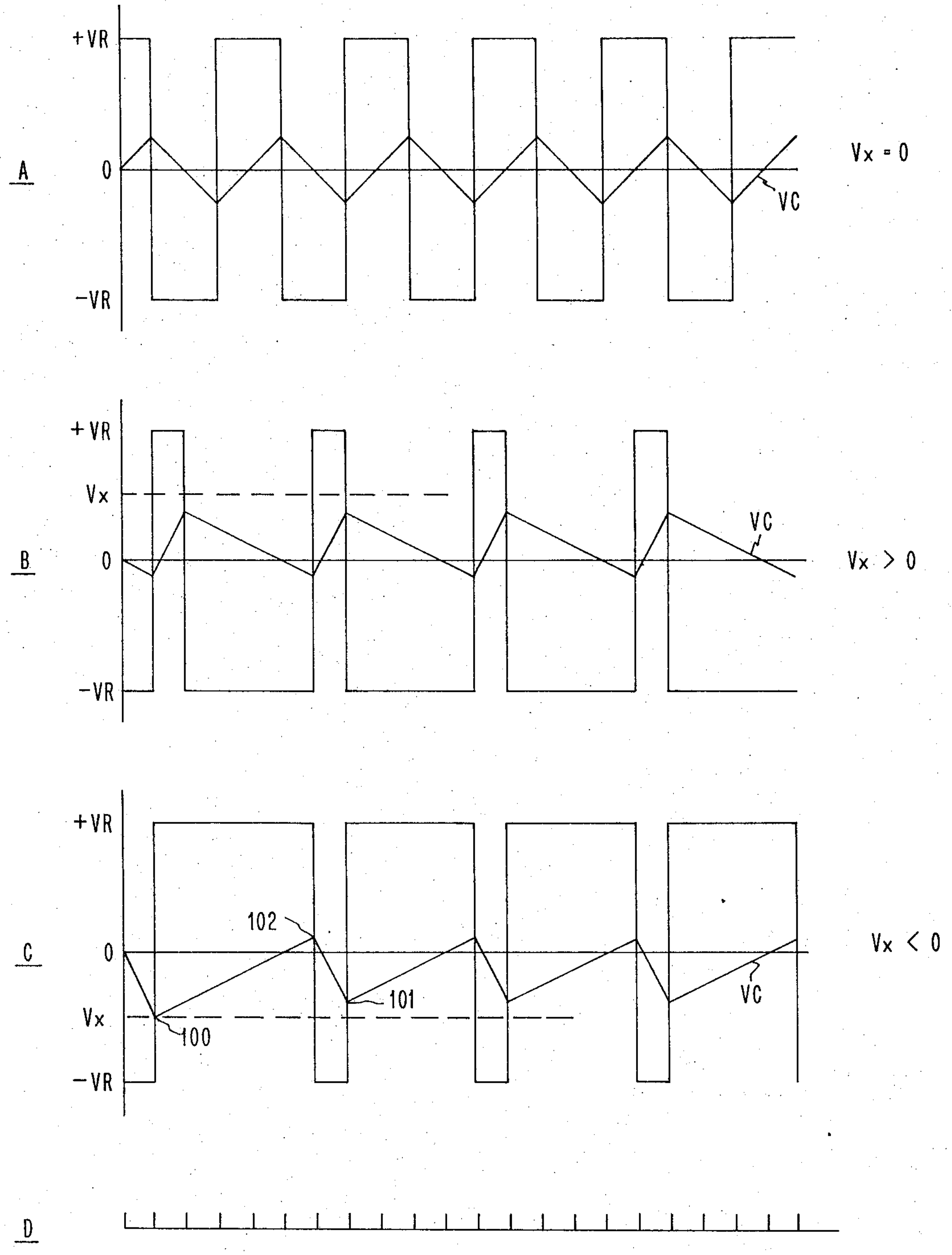
FIG. 8 contains a time-base diagram of typical operation of circuitry such as is shown in FIGS. 5 or 7 for several cases of unknown analog input.

As mentioned, FIG. 8 illustrates several examples of typical operation particularly applicable to either the FIG. 5 or FIG. 7 configurations. The variation of the capacitor voltage VC close to and around the zero level is clearly evident in FIG. 8. As in FIG. 3, the vertical excursions of voltage VC are illustrated in FIGS. 8A-C greatly exaggerated from that which would be actually observable on an oscilloscope. FIG. 8 is shown with the exaggerated VC levels to clearly illustrate the circuit operation rather than to show relative magnitudes between VC and VR. FIG. 8A shows the case wherein VX equals zero which means that the positive and negative reference are applied symmetrically further implying that the counter would be half full at the end of the timer period. To illustrate the exaggerated excursions of VC as mentioned above, an oscilloscope pattern of an actual circuit with VX of zero would show a VC waveform of less than one hundredth of the excursions shown in FIG. 8A for the same relative magnitudes of VR. In FIG. 8B, a positive VX is applied so that the positive slope is shown rising more steeply while the positive VR is applied as compared to the negative slope while the negative VR is applied. FIG. 8C shows the negative VX situation and also illustrates a one count initial ambiguity. That is, the fact that VC starts from zero means that it will reach a slightly greater negative magnitude when transition point 100 is reached than it will at the next negative to positive transition point 101. Therefore, a single clock pulse ambiguity results since the first period that plus VR is applied is longer than after the circuit has stabilized by a single clock pulse. This one count ambiguity frequently is sufficiently insignificant to justify ignoring it. If not, the first two transitions 100 and 102 can be ignored as mentioned previously and the timer cycle and counter operation initiated by transition 102. Although FIG. 8C appears to show VC reaching VX at clock transition 100, in actual operation the excursion of VC prior to transition 100 would be radically less than VX. FIG. 8D shows hypothetical clock pulses which might typically be transitions of a square wave. Note that a relatively small number of clock pulses are counted for a negative VX (FIG. 8C) during application of the negative reference potential as compared to the number of such clock pulses counted during the application of the negative reference for a positive V*x*. Ideally, no clock pulses would be counted when V*x* is equal to or less than the negative VR whereas the counter would be filled when V*x* is equal to or more positive than the positive reference voltage.

Figure 9:
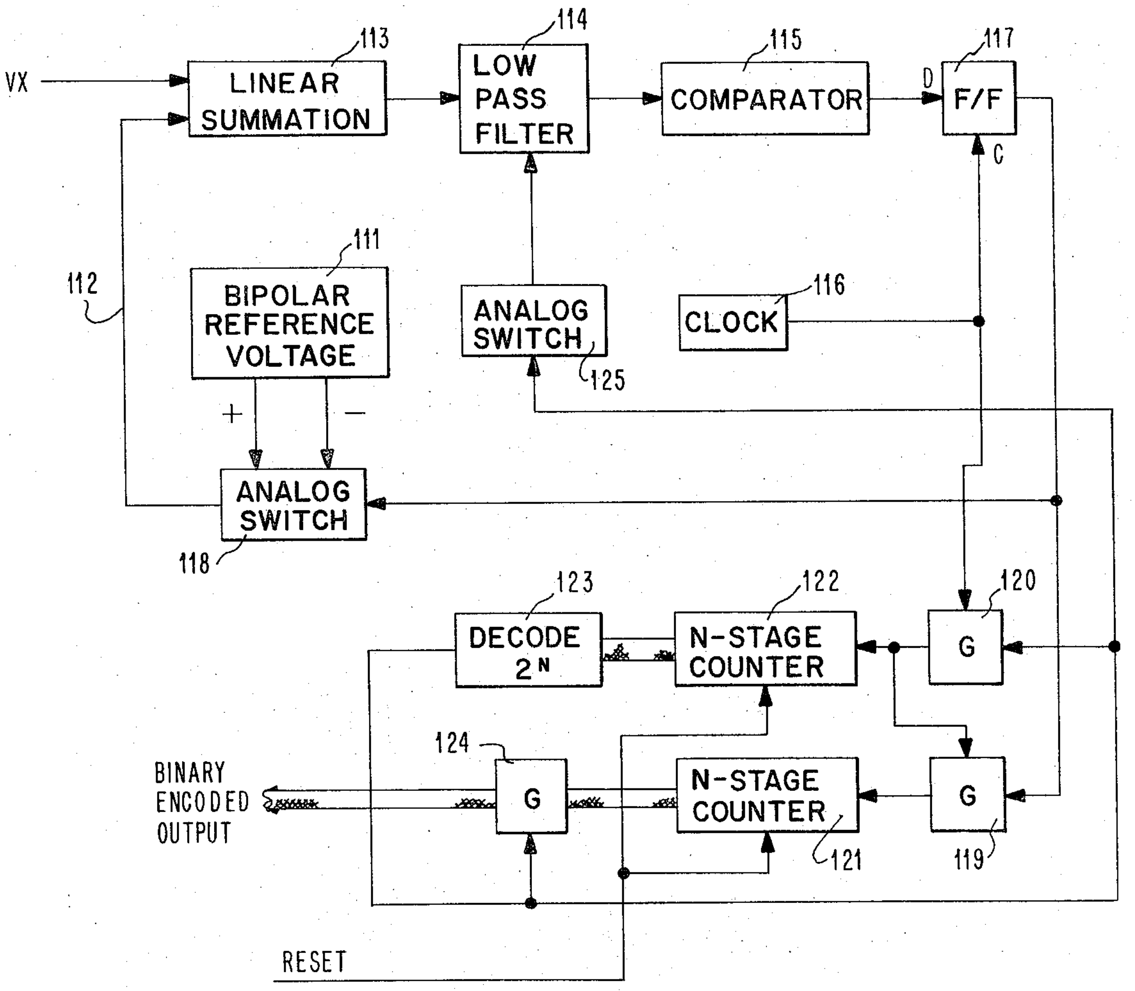
FIG. 9 presents a general block configuration of an ADC in accordance with this invention similar to FIGS. 5 and 7.

FIG. 9 depicts the interrelation of various block functions for this invention when configured to operate in a manner similar to FIGS. 5 and 7. In this circuit, the unknown analog input VX is combined with a reference voltage feedback signal 112 from bipolar source 111 in linear summation network 113. This summation is effectively averaged by low pass filter 114 to provide the input for comparator 115 with the polarity of the output of 115 being a function of a comparison with a predetermined voltage level (shown as circuit ground in FIGS. 5 and 7). Each time it is enabled by a strobe pulse from clock 116, flip-flop 117 will produce an output reflecting the polarity of comparator 115 output. Analog switch 118 responds to level of flip-flop 117 output to connect the appropriate polarity of reference voltage from source 111 to 112. In addition, the output of F/F 117 that causes negative VR to be connected to 112 also enables gate 119 to pass clock pulses from gate 120 into counter 121.

By means not shown, gate 120 is initiated by a start signal to commence passing clock 116 pulses to both gate 119 and timer counter 122. The presence of a predetermined count in counter 122 is detected by decoder 123 which then deconditions gate 120, conditions gate 124 so that the count in 121 can be read out, and actuates analog switch 125 so as to ground the input to comparator 115 via network 114. Each conversion cycle is preceded by a reset of counter 121 and 122 and is initiated by conditioning gate 120 while analog switch 125 removes the ground from comparator 115. Note that FIG. 3 shows counting during positive VR feedback since the FIG. 2 circuit associated therewith operates upon the differential result of comparing VX and the average of VR whereas FIG. 8 shows counting during negative VR application for FIGS. 5 and 7 since they operate upon the differential between ground potential and the average of the VX/VR summation.

While the novel features of the present invention have been shown and described in detail in conjunction with the discussion of the foregoing preferred embodiments thereof, it will be understood by those skilled in the art that many changes in form and detail other than those specifically mentioned herein may be made without departing from the spirit and scope of this invention.

What is claimed is:

1. Apparatus for converting an unknown analog signal to an equivalent digital representation comprising
a source of positive and negative reference signals,
means capable of comparing input levels coupled thereto and producing an output indicative of the differential therebetween,
switching means responsive to the polarity of the output of said comparing means for producing a said reference signal from said source as an output with a polarity which will cause the level of said comparing means output to approach a reference level, means for enabling said switching means following each polarity change of the output of said comparing means, network means having said unknown analog signal and said switching means output signal connected as inputs thereto for coupling said network means inputs as input levels to said comparing means so that at least one of said network means inputs is thus coupled as a cumulative time average thereof, and means for measuring the amount of time at least one of said reference signals is produced as an output by said switching means during a preselected time period.

2. Apparatus in accordance with claim 1 wherein said network means includes means for directly coupling said unknown analog signal as one input to said comparing means, and means for coupling a cumulative time average of said switching means output as a second input to said comparing means.

3. Apparatus in accordance with claim 2 wherein said cumulative time average coupling means includes a capacitor coupled for accumulating a charge from the said reference signal output from said switching means for providing said second input for said comparing means.

4. Apparatus in accordance with claim 1 which includes capacitor means, a standard signal level source, means for summing said unknown analog signal and said switching means output and for charging said capacitor as a function of the summation, and means for applying the charge contained in said capacitor to one of said comparing means input and said standard signal level to another of said comparing means inputs.

5. Apparatus in accordance with claim 1 which further includes means for providing a continuous stream of clock pulses, said enabling means being coupled to respond to transitions of said clock pulses to effect said reference signal switching, said measuring means including a. first counting means responsive to a start signal for counting a predetermined number of said clock pulses and for providing an output signal reflecting a count of said predetermined number, b. second counting means, and c. logic means operable during the time period between the start signal and said first counting means output for permitting said second counting means to count said clock pulses occurring during all times a preselected one of said reference signals is coupled to provide an input to said comparing means.

6. Apparatus for converting an unknown analog signal to an equivalent digital representation comprising a comparator capable of inspecting input signals thereto and producing an output reflecting the polarity of the difference between said input signals, first coupling means for coupling the unknown analog signal to one of the inputs to said comparator, means for producing a continuous train of clock pulses, a source of positive and negative reference signals, means connected to said source of reference signals and being actuated during at least a portion of each said clock pulse for inspecting the polarity of the output of said comparator and for producing as an output thereof a said reference signal from said source with a polarity opposite the polarity of said comparator output, second coupling means coupling said inspecting means output to said comparator input, at least one of said first and second coupling means including means for converting the input thereto into a time related function of the said input for providing the input to said comparator, means for producing a start signal, timer means for providing an output signal indicative that a preselected time period has passed following each said start signal, a counter, means for gating said clock pulses to said counter during all times between a said start signal and its following said timer means output that said inspecting means output is of a preselected polarity, digital data utilization means, and means responsive to said timer means output for enabling the transfer of the contents of said counter to said utilization means.

7. Apparatus in accordance with claim 6 wherein said comparator is a differential amplifier having one input connected to a ground reference, said first coupling means includes a first resistive element, said second coupling means includes a second resistive element, a capacitor connected on one side to said ground reference and commonly connected on the other side to (a) said first and second resistive elements and (b) a second input for said differential amplifier.

8. Apparatus in accordance with claim 7 wherein said second coupling means further includes means for changing the magnitude of the said reference signal being coupled to said capacitor.

9. Apparatus in accordance with claim 8 which further includes multiple sources of unknown analog signals, multiplex means connected to said analog signal sources, selecting means for causing said multiplex means to connect a particular one of said analog signals to said analog signal coupling means, and means for discharging said capacitor whenever a conversion cycle is not being performed.

10. Apparatus in accordance with claim 8 wherein said timer means includes a second counter for producing said output signal whenever a preselected count is present therein, and means responsive to said start signal for gating said clock pulses into said second counter until said preselected count is reached.

11. Apparatus in accordance with claim 6 which further includes multiple sources of unknown analog signals, a plurality of signal handling groups each including a said comparator, a said inspecting means, a first coupling means and a second coupling means, each said group being connected for receiving at least one of said multiple analog signals, said apparatus further including means for selecting one of said signal handling groups for performing a conversion cycle with said counter and said gating means in accordance with the state of the said inspecting means output for the selected said signal handling group.

* * * * *